(12) United States Patent
Hilgendorf et al.

(10) Patent No.: US 6,989,696 B2
(45) Date of Patent: Jan. 24, 2006

(54) SYSTEM AND METHOD FOR SYNCHRONIZING DIVIDE-BY COUNTERS

(75) Inventors: Rolf Hilgendorf, Boeblingen (DE); Jens Kuenzer, Leinfelden-Echterdingen (DE); Cédric Lichtenau, Boeblingen (DE); Thomas Pflueger, Leinfelden (DE); Mathew I. Ringler, Burlington, VT (US); Gerard M. Salem, Essex Junction, VT (US); Peter A. Sandon, Essex Junction, VT (US); Dana J. Thygesen, Monkton, VT (US); Ulrich Weiss, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/707,066

(22) Filed: Nov. 19, 2003

(65) Prior Publication Data

US 2005/0104637 A1 May 19, 2005

(51) Int. Cl.
*H03L 7/00* (2006.01)
(52) U.S. Cl. ........................ 327/154; 375/356
(58) Field of Classification Search ............... 327/141, 327/144–147, 151–156, 160–163, 291–299, 327/154; 375/356; 331/14, 25, DIG. 2
See application file for complete search history.

(56) References Cited

U.S. PATENT DOCUMENTS

| | | | | |
|---|---|---|---|---|
| 4,506,175 A | * | 3/1985 | Reitmeier et al. | 327/12 |
| 5,317,601 A | * | 5/1994 | Riordan et al. | 375/356 |
| 5,638,028 A | * | 6/1997 | Voth | 331/25 |
| 5,663,687 A | * | 9/1997 | Kozu | 331/14 |
| 5,844,436 A | * | 12/1998 | Altmann | 327/156 |

* cited by examiner

*Primary Examiner*—Minh Nguyen
(74) *Attorney, Agent, or Firm*—Downs Rachlin Martin PLLC

(57) ABSTRACT

A synchronization system capable of simultaneously resetting frequency divide-by counters ($124_A$, $124_B$) of multiple processors (A, B) to zero regardless of the divide-by frequency signal (Mclk/n signal ($168_A$, $168_B$)) and regardless of the magnitude of the clock mesh delays experienced by the Mclk/n signals in the processors. The synchronization system includes a mesh delay circuit ($176_A$, $176_B$) for each processor that simulates in the undivided signal (Mclk/1 signal ($136_A$, $136_B$)) the clock mesh delay experienced by the Mclk/n signal in that processor so as to provide an Lclk signal ($172_A$, $172_B$). A phase detector detects the phase offset between the Mclk/n signal and the Sysclk signal (112) and sends an asynchronous offset signal ($194_A$, $194_B$) to a counter re-setter ($196_A$, $196_B$) that resets the divide-by counter to zero based on the offset signal.

17 Claims, 4 Drawing Sheets

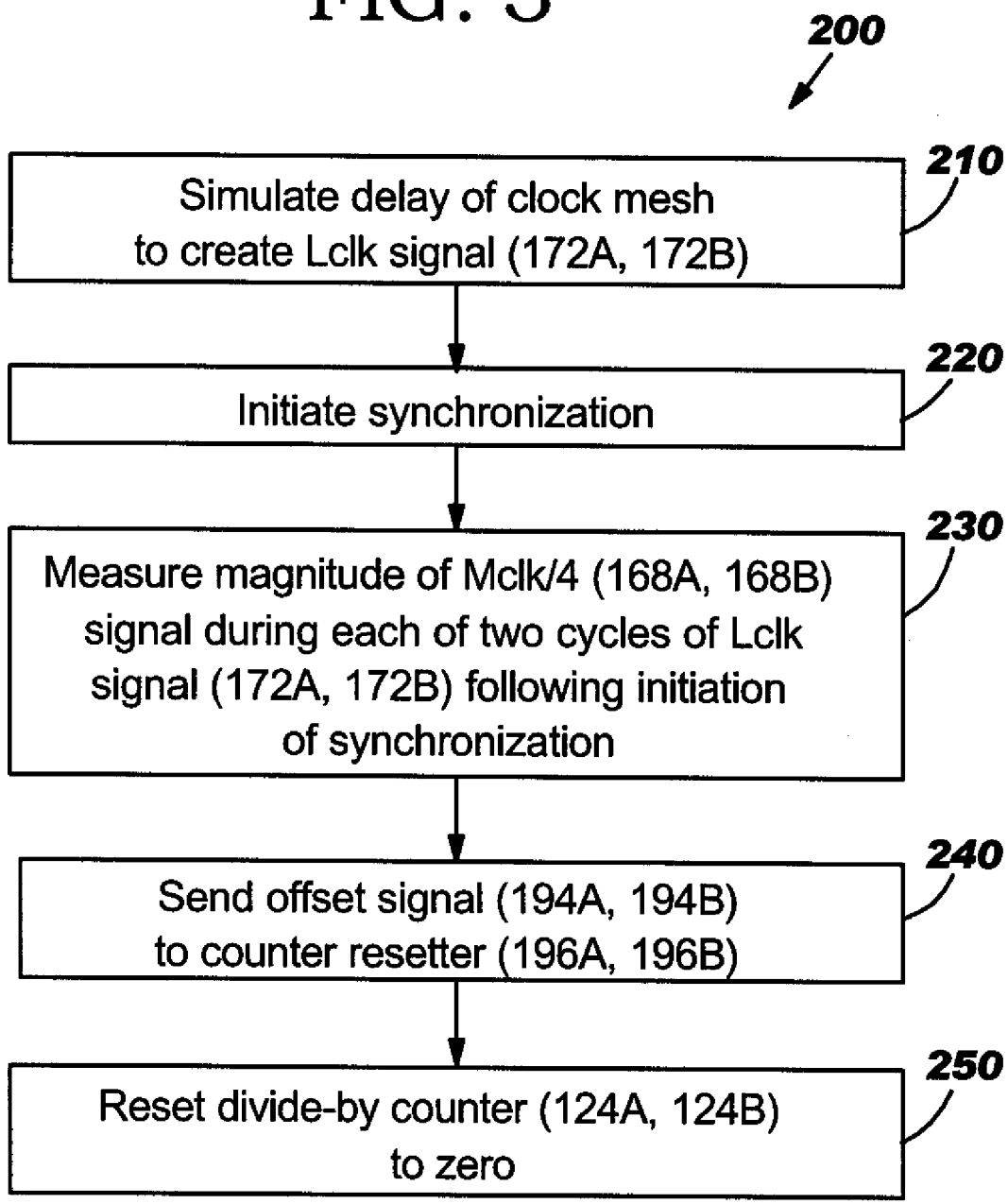

SYSTEM AND METHOD FOR SYNCHRONIZING DIVIDE-BY COUNTERS

BACKGROUND OF INVENTION

FIELD OF THE INVENTION

The present invention generally relates to the field of integrated circuits. More particularly, the present invention is directed to a system and method for synchronizing multiple divide-by counters with one another.

BACKGROUND OF THE INVENTION

Trends toward mobile and wireless computing and other power-sensitive applications utilizing various integrated circuit (IC) chips have created a need for multi-power-mode ICs that can operate in relatively low power mode when full processing speed is not needed. One approach for decreasing the dynamic power consumption of an IC is to slow down its functional clock(s). One way to slow down such clocks is to scale the clock frequency dynamically using a divide-by counter to generate one or more signals that each have a frequency that is a fraction of the full-power frequency. Each of these fractional, or divide-by, frequency clock signals may then be used during a low-power mode.

For operations such as system frequency scaling, voltage scaling and communications, it is necessary that systems containing multiple divide-by counters have their counters synchronized with one another. However, a synchronization problem arises at startup due to the initial states of the divide-by counters being unknown. A conventional solution to synchronizing multiple divide-by counters would be to synchronize the counters to a system clock. This solution, however, is not satisfactory when the clock signal experiences a clock mesh delay, i.e., the delay caused by the clock mesh between each divide-by counter and the clocked functional latches, is greater than the cycle time of the corresponding clock. This is so because across the various frequencies of the multiple clock domains, the individual counters could be reset to different clock cycles since the respective signals are in separate domains. Accordingly, there is a need for a system and method for synchronizing multiple divide-by counters across multiple clock domains.

SUMMARY OF INVENTION

In one aspect, the present invention is directed to an integrated circuit comprising a clock divider circuit that includes a counter operatively configured to generate a plurality of first signals from a second signal. Each one of the plurality of first signals has a first phase, and the second signal has a second phase. A mux is in electrical communication with the counter and is operatively configured to output a selected one of the plurality of first signals. A phase detector is operatively configured to detect an offset between the first phase of the selected one of the plurality of first signals and the second phase of the second signal and output a third signal representing the offset.

In another aspect, the present invention is directed to a method of resetting at least one divide-by counter having an input signal with a first phase, the divide-by counter outputting a plurality of divide-by signals each having a second phase. The method comprises the steps of selecting one of the plurality of divide-by signals and determining a phase offset between the second phase of the selected one of the plurality of divide-by signals and the first phase of the input signal. The divide-by counter is then reset based upon the phase offset.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein:

FIG. 3 is a flow diagram for a method of synchronizing multiple divide-by counters with one another in accordance with the present invention.

DETAILED DESCRIPTION

Figure 1:
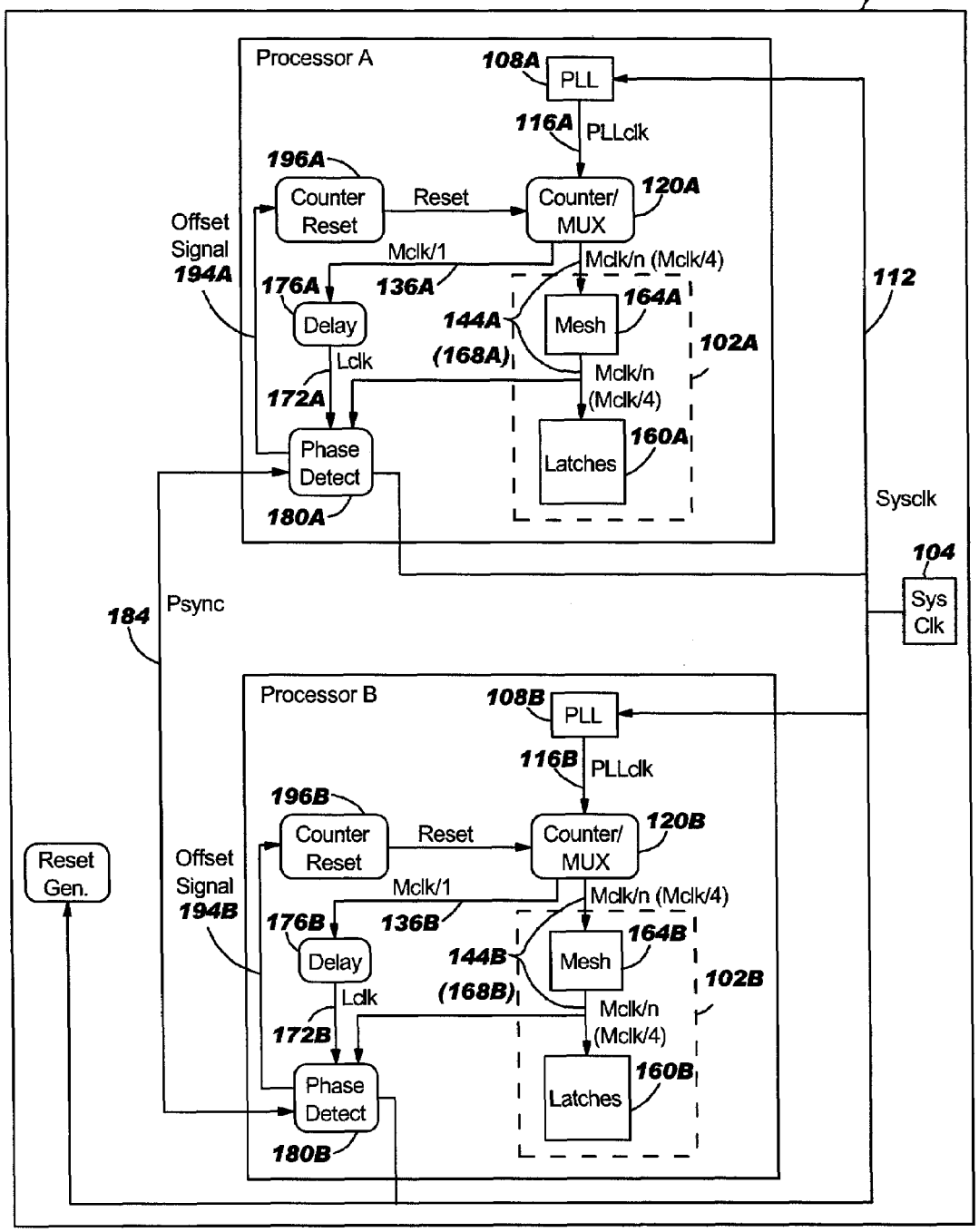
FIG. 1 is a high-level schematic diagram of a multiprocessor system wherein each processor includes a divide-by counter synchronization system according to the present invention.

Referring now to the drawings, FIG. 1 shows in accordance with the present invention a multi-processor system, which is generally denoted by the numeral 100. System 100 may include any number of processors, e.g., processor A and processor B, each having functional circuitry $102_A$, $102_B$ grossly timed by a common system clock 104. It is noted that two processors A, B are shown merely for the sake of simplicity and convenience in describing the invention. Those skilled in the art will readily understand the changes necessary to implement the present invention with any number of processors. Each processor A, B may be contained on separate chips or may be integrated into a single chip, e.g., within a system-on-chip type IC. Processors A, B may communicate with one another and/or external circuits/devices (not shown) via one or more communication links (not shown). Detailed descriptions of such communication links and external circuits/devices are not necessary for those skilled in the art to understand the broad scope of the present invention and how to practice the invention to its full scope.

Each processor A, B may contain, among other things, a PLL $108_A$, $108_B$ that locks onto a Sysclk signal 112 generated by system clock 104. PLL $108_A$, $108_B$ may be any type of conventional PLL used for generating a clock signal, i.e., PLLclk signal $116_A$, $116_B$. Those skilled in the art will readily understand how to make a suitable PLL $108_A$, $108_B$ such that a detailed description of the PLL is not necessary for those skilled in the art to practice the present invention. PLLclk signal $116_A$, $116_B$ is provided to a counter/mux (multiplexer) system $120_A$, $120_B$, which is shown in more detail in FIG. 2A.

Figure 2A:
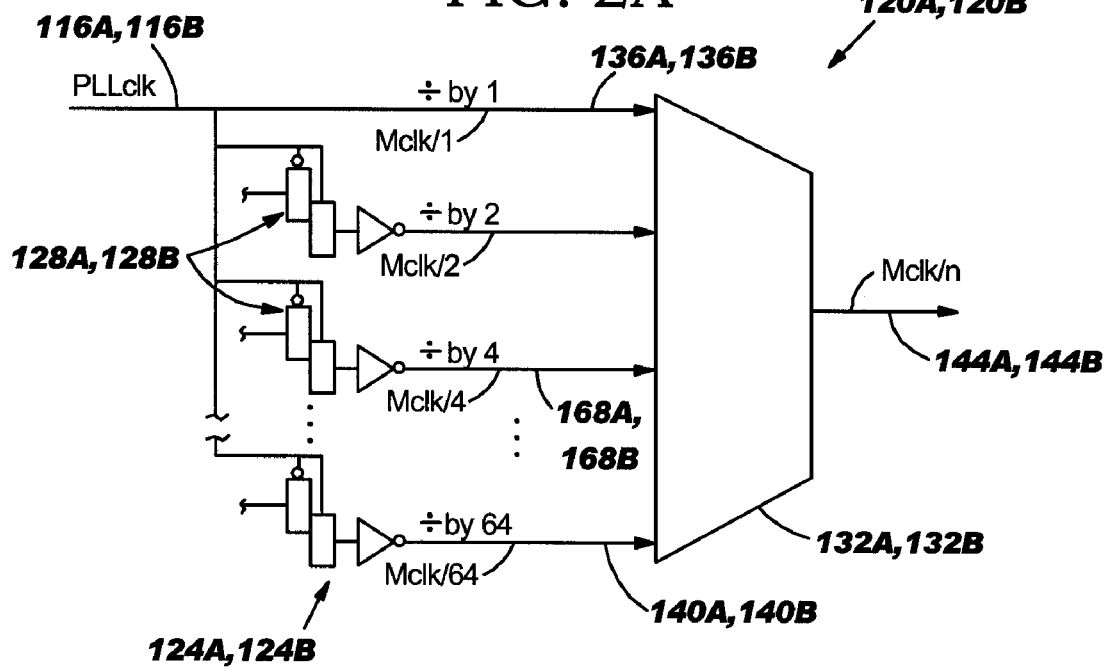
FIG. 2A is a schematic diagram of the divide-by counter/mux systems of the processors of FIG. 1.

Referring to FIG. 2A, each counter/mux system $120_A$, $120_B$ comprises a divide-by counter $124_A$, $124_B$, e.g., a count-up type counter, that includes a number of latches 128A, 128B for dividing the frequency of PLLclk into various divide-by frequencies, e.g., Mclk/1, Mclk/2, Mclk/4 ... Mclk/64 ... Mclk/n, where n=$2^x$, where x is any integer equal to or greater than zero. Accordingly, the number of latches $128_A$, $128_B$ needed for each divide-by counter $124_A$, $124_B$ corresponds to the smallest divide-by frequency desired. For example, if the lowest desired frequency is one-sixty-fourth of the frequency of PLLclk signal 116A (i.e., Mclk/64 signal), counter $124_A$ would require at least six latches $116_A$. The outputs of latches $116_A$, $116_B$ of each counter $124_A$, $124_B$ are input into a corresponding mux $132_A$, $132_B$, which permits the selection of the one of the divide-by Mclk/n signals to be provided to functional circuitry $102_A$, $102_B$ (FIG. 1). For example, if functional circuitry $102_A$, $102_B$ must be in a full-power mode, Mclk/1 signal $136_A$, $136_B$, i.e., the full frequency of PLLclk signal $116_A$, $116_B$, may be selected via mux $132_A$, $132_B$ and thereby provided to the functional circuitry. On the other hand, if a low-power mode is considered to be a situation wherein functional circuitry $102_A$, $102_B$ is clocked at one-sixty-fourth of the frequency of PLLclk signal 116A, 116B, then Mclk/64 signal $140_A$, $140_B$ may be selected during the low-power mode via mux and thereby provided to the functional circuitry.

Figure 2B:
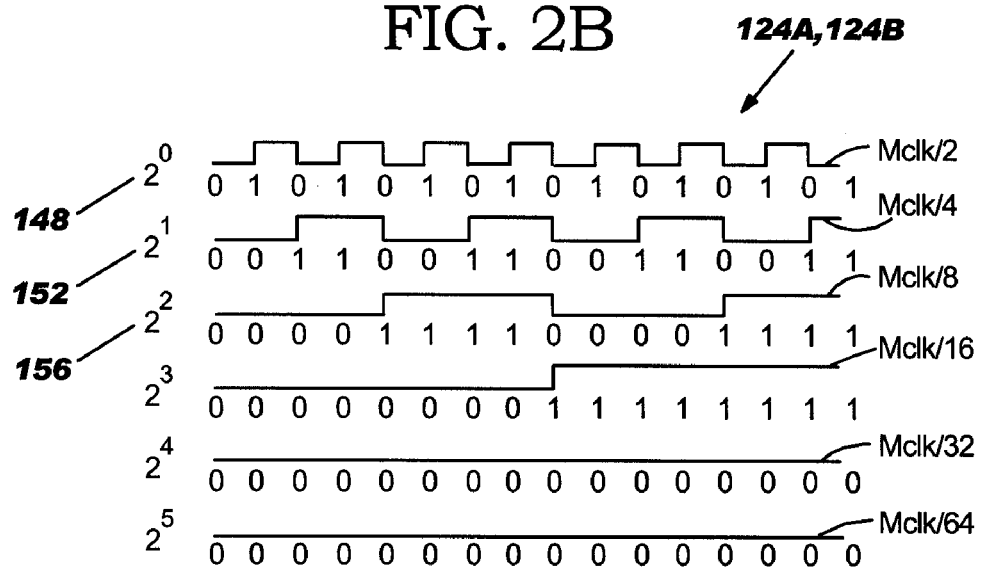
FIG. 2B is a diagram illustrating the manner in which the divide-by counter of FIG. 2A generates divide-by frequencies.

FIG. 2B illustrates the manner in which latches $128_A$, $128_B$ of each counter $124_A$, $124_B$ of FIG. 2A generate the various frequencies of the corresponding divide-by frequency Mclk/n signal $144_A$, $144_B$ When counter $124_A$, $124_B$ is a count-up type counter, after the counter is reset it counts from zero to its maximum (i.e., every latch containing a 1) in repeating manner until PLLclk signal $116_A$, $116_B$ is no longer provided. For example, when counter $124_A$, $124_B$ is a six-bit counter capable of providing a Mclk/64 signal, it repeatedly counts by ones from $0_{10}$ ($000000_2$) to $127_{10}$ ($111111_2$). The $2^0$ latch changes state at one-half the frequency of PLLclk signal $116_A$, $116_B$ to generate Mclk/2 signal, the $2^1$ latch changes state at one-quarter the frequency of PLLclk signal to generate Mclk/4 signal, the $2^2$ latch changes state at one-eighth the frequency of PLLclk signal to generate Mclk/8 signal, and so on.

Referring again to FIG. 1, each set of functional circuitry $102_A$, $102_B$ may contain the logic, communications, memory and/or other circuitry that provides the corresponding processor A, B with its functionality. Those skilled in the art will understand that a detailed description of functional circuitry $102_A$, $102_B$ is not necessary herein, since it may be any such circuitry routinely designed within the art for a particular application. That said, functional circuitry $102_A$, $102_B$ may be generally characterized as having a plurality of latches $160_A$, $160_B$ that are clocked by Mclk/n signal $144_A$, $144_B$ output from counter/mux system $120_A$, $120_B$. Once Mclk/n signal $144_A$, $144_B$ is output from counter/mux circuitry $120_A$, $120_B$, it reaches latches $160_A$, $160_B$ via a clock mesh $164_A$, $164_B$, which typically include a plurality of buffers (not shown), e.g. inverters, and wires (not shown) that branch down to the individual latches. Clock mesh $164_A$, $164_B$ may be any conventional or other clock mesh. Clock mesh $164_A$, $164_B$ causes a delay, primarily due to the length of wiring and buffers through which Mclk/n signal $144_A$, $144_B$ must travel between counter/mux system $120_A$, $120_B$ and latches $160_A$, $160_B$, Of course, the greatest delay will be present at the one (s) of latches $160_A$, $160_B$ where Mclk/n signal $144_A$, $144_B$ must travel through the longest wiring path and/or most buffers. Depending upon the frequency of sysclk signal 112 and the PLL multiplication factor, the delay in clock mesh $164_A$, $164_B$ may be longer than one cycle of PLLclk signal $116_A$, $116_B$, As discussed in the background section above, such a long delay through clock mesh $164_A$, $164_B$ complicates synchronizing divide-by counters $124_A$, $124_B$ (FIG. 2A) of processors A, B with one another.

Referring to FIGS. 1, 2A, 3 and 4, FIG. 3 illustrates a method 200 of synchronizing divide-by counters $124_A$, $124_B$ of processors A, B with one another regardless of the amount of the delay in Mclk/n signal $144_A$, $144_B$ due to clock mesh $164_A$, $164_B$, It is noted that method 200 is described particularly with respect to Mclk/4 signal $168_A$, $168_B$, which, as discussed above, has a frequency of one-quarter the frequency of PLLclk signal $116_A$, $116_B$, As will be appreciated, method 200 can be extended to any of divide-by signals having a frequency smaller than the frequency of Mclk/4 signal $168_A$, $168_B$. This extension is discussed below, following the description of method relative to Mclk/4 signal $168_A$, $168_B$.

In general, method 200 begins in step 210 by simulating the delay that is caused by clock mesh $164_A$, $164_B$ in a signal, e.g., Mclk/1 signal $136_A$, $136_B$, which may be the same as PLLclk signal $116_A$, $116_B$, so as to generate a delayed Lclk signal $172_A$, $172_B$ having the same delay as Mclk/4 signal $168_A$, $168_B$ after it propagates through clock mesh $164_A$, $164_B$. Delay may be introduced into Mclk/1, signal $136_A$, $136_B$ via delay circuitry 176. Sysclk signal 112 and Mclk/4 signal $168_A$, $168_B$ are input into a phase detector clocked by the Lclk signal $172_A$, $172_B$ that detects whether or not the Mclk/4 signal is out of phase with the Sysclk signal 112. The reason Mclk/4 signal $168_A$, $168_B$ may be out of phase with Sysclk signal 112 is that, as mentioned in the background section above, when divide-by counters $124_A$, $124_B$ startup, the state of each latch $128_A$, $128_B$ is unknown, i.e., may be either a 0 or a 1. Mclk/4 signals $168_A$, $168_B$ may be out of phase depending upon the states of latches $128_A$, $128_B$ corresponding to the two least significant bits of counter, i.e., $2^0$ and $2^1$ latches 148, 152 (FIG. 2B).

Figure 4:
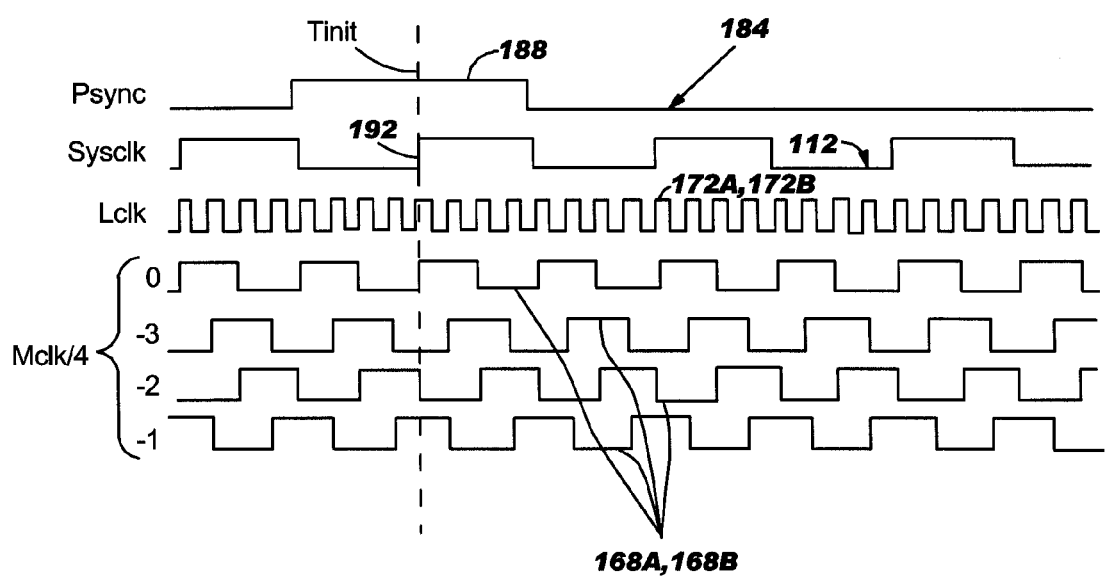
FIG. 4 is a timing diagram illustrating the states of Psync, Sysclk and Lclk signals of FIG. 1 before, during and after synchronization and illustrating the four possible offsets of Mclk/4 signal of FIG. 1 prior to initiation of synchronization.

At step 220, synchronization may be initiated at time $T_{init}$. using a Psync signal 184, e.g., a single pulse signal. For example, during a pulse 188 of Psync signal 184 and at a rising edge 192 of Sysclk signal 112, at step 230 phase detector $180_A$, $180_B$ will take two measurements of Mclk/4 signal $168_A$, $168_B$ during the next two cycles of Lclk signal $172_A$, $172_B$. The values of these two measurements will determine the amount that Mclk/4 signal $168_A$, 168B is shifted relative to Sysclk signal 112. Referring particularly to FIG. 4, it is seen that there are four possible states of phase difference between both Mclk/4 signals $168_A$, $168_B$, a 0 phase shift (i.e., in phase), a –3 phase shift (i.e., 90° lagging), a –2 phase shift (i.e., 180° lagging) and a –1 phase shift (i.e., 270° lagging). As will become apparent after reading the description below, the phase shift designations "0," "–1," "–2" and "–3" refer to the base ten number that must be subtracted from corresponding divide-by counter $124_A$, $124_B$ (FIG. 2A) in order to reset that counter so that Mclk/4 signals $168_A$, $168_b$ are in phase.

With continuing reference particularly to FIG. 4, it is seen that if Mclk/4 signal 168A, 168B is in phase with Sysclk signal 112 (0 phase shift), the two measurements of the Mclk/4 signal following initiation of phase detection will be 1, 1 since the Mclk/4 signal is high during both of the two cycles of the Lclk signal following initiation of phase detection. Similarly, if Mclk/4 signal $168_A$, $168_B$ is 90° lagging relative to Sysclk signal 112 ("–3" phase shift), the two measurements of the Mclk/4 signal will be 0, 1 since the Mclk/4 signal switches from low to high during the two measurement cycles of the Lclk signal. If Mclk/4 signal $168_A$, $168_B$ is 180° lagging relative to Sysclk signal 112 ("–2" phase shift), the two measurements of Mclk/4 signal will be 0, 0 since the Mclk/4 signal is low during the two measurement cycles of the Lclk signal. Lastly, if Mclk/4 signal $168_A$, $168_B$ is 270° lagging relative to Sysclk signal 112 ("−1" phase shift), the two measurements of the Mclk/4 signal will be 1, 0 since the Mclk/4 signal switches from high to low during the two measurement cycles of the Lclk signal.

Once phase detector $180_A$, $180_B$ detects the phase difference between Mclk/4 signal $168_A$, $168_B$ and Sysclk signal 112, at step 240, the phase detector may send an offset signal $194_A$, $194_B$ to counter re-setter $196_A$, $196_B$ that may be configured to (re)set the corresponding divide-by counter $124_A$, $124_B$ to zero at step 250. Offset signal $194_A$, $194_B$ may be an asynchronous signal containing information that allows re-setter $196_A$, $196_B$ to reset divide-by counter $124_A$, $124_B$ to zero. Referring particularly to FIG. 2B, it can be seen that measurements by phase detector $180_A$, $180_B$ of Mclk/4 signal $168_A$, $168_B$ can be related to the state of $2^1$ latch 152 as divide-by counter $124_A$, $124_B$ (FIG. 2A) counts. These measurements can also be related to the states of $2^1$ and $2^0$ latches 152, 148 at the time phase detection was initiated at time $T_{init}$. (FIG. 4).

That is, when Mclk/4 signal $168_A$, $168_B$ is in phase with Sysclk signal 112 such that the two measurements are 1, 1, it can be seen from FIG. 2B that in the very next cycle of divide-by counter $124_A$, $124_B$ following the two cycles of the counter wherein the states of $2^1$ latch 152 are 1, 1, the states of $2^1$ and $2^0$ latches 152, 148 are 0, 0, respectively. Similarly, when the two measurements are 0, 1, i.e., Mclk/4 signal $168_A$, $168_B$ is 90° lagging with respect to Sysclk signal 112 ("−3" phase shift), the states of $2^1$ and $2^0$ latches 152, 148 in the very next cycle of divide-by counter $124_A$, $124_B$ following the two consecutive cycles of the counter wherein the states of $2^1$ latch 152 are 0, 1, and 1, 1, respectively. Accordingly, to reset divide-by counter $124_A$, $124_B$ so that $2^1$ and $2^0$ latches 152, 148 each contain a "0", effectively, the number $3_{10}$ must be subtracted from the counter, which would contain the number $3_{10}$, i.e., $(11)_2$, if the counter were not reset.

Similar determinations may be made for the phase differences of 180° and 270° lagging. For 180° lagging ("−2" phase shift), the states of $2^1$ and $2^0$ latches 152, 148 are 1, 0, respectively, in the cycle following the two cycles wherein the state of the $2^1$ latch 152 is, consecutively, 0, 0. Accordingly, to reset $2^1$ and $2^0$ latches 152, 148 of divide-by counter $124_A$, $124_B$ to zero, effectively, the number $2_{10}$ must be subtracted from the counter, which would contain the number $2_{10}$, i.e., $(10)_2$, if the counter were not reset. Finally, for 270° lagging ("−1" phase shift), the states of $2^1$ and $2^0$ latches 152, 148 are 0, 1, respectively, in the cycle following the two cycles wherein the state of the $2^1$ latch 152 is, consecutively, 1, 0. Accordingly, to reset $2^1$ and $2^0$ latches 152, 148 of divide-by counter $124_A$, $124_B$ to zero, effectively, the number $1_{10}$ must be subtracted from the counter, which would contain the number $1_{10}$, i.e., $(01)_2$, if the counter were not reset.

Divide-by counters $124_A$, $124_B$ of processors A, B may be reset as described above. As can be appreciated, as long as any delays inherent in phase detectors, counter re-setter and associated wiring are the same for processors A, B across all divide-by frequencies, divide-by counters of the two processors will reset to zero at the same time when synchronization is initiated on the same pulse of Psync 184 signal. That said, any unsuitable delay can be compensated for by clocking counter re-setter $196_A$, $196_B$, e.g., using sysclk signal or a separate pulsed reset signal to activate the counter re-setters at the same time.

As mentioned above, method 200 of resetting and synchronizing divide-by counters $124_A$, $124_B$ based on Mclk/4 signal $168_A$, $168_B$ can be readily extended to any divide-by frequency smaller than the one-quarter frequency of the Mclk/4 signal. In performing method for any divide-by frequency less than the one-quarter frequency of Mclk/4 signal $168_A$, $168_B$, the primary difference from performing the method for the Mclk/4 signal will be in the number of phase offset states and, accordingly, the number of measurements that must be taken to determine the offset for resetting divide-by counter $124_A$, $124_B$. In general, the number of phase offset states will be equal to the value of "n" in the divide-by frequency in the corresponding Mclk/n signal $144_A$, $144_B$, and the number of measurements needed to determine the phase offset present in that Mclk/n signal will be equal to n/2. The remaining steps of method 200 will generally be the same as the steps for Mclk/4 signal $168_A$, $168_B$.

While the present invention has been described in connection with a preferred embodiment, it will be understood that it is not so limited. On the contrary, it is intended to cover all alternatives, modifications and equivalents as may be included within the spirit and scope of the invention as defined above and in the claims appended hereto.

What is claimed is:

1. An integrated circuit, comprising:
   (a) a clock divider circuit comprising:
      (i) a counter operatively configured to generate a plurality of first signals from a second signal, each one of said plurality of first signals having a first phase and said second signal having a second phase; and
      (ii) a mux in electrical communication with said counter and operatively configured to output a selected one of said plurality of first signals;
   (b) a phase detector operatively configured to detect an offset between said first phase of said selected one of said plurality of first signals and said second phase of said second signal and generate a third signal representing said offset; and
   (c) a clock mesh having a mesh delay and delay circuitry, wherein said selected one of said plurality of first signals propagates to said phase detector through said clock mesh and said delay circuitry is operatively configured to simulate said mesh delay, said second signal propagating to said phase detector through said delay circuitry.

2. An integrated circuit according to claim 1, wherein said selected one of said plurality of first signals has a frequency equal to the frequency of said second signal divided by an even integer n and said phase detector is operatively configured to measure said selected one of said plurality of first signals n/2 times to determine said offset.

3. An integrated circuit, comprising:
   (a) a clock divider circuit comprising:
      (i) a counter operatively configured to generate a plurality of first signals from a second signal, each one of said plurality of first signals having a first phase and said second signal having a second phase, said counter comprising a plurality of latches each corresponding to a corresponding one of said plurality of first signals;
      (ii) a mux in electrical communication with said counter and operatively configured to output a selected one of said plurality of first signals;
   (b) a phase detector operatively configured to detect an offset between said first phase of said selected one of said plurality of first signals and said second phase of said second signal and generate a third signal representing said offset; and (c) counter reset circuitry responsive to said third signal so as to reset to zero the one of said plurality of latches corresponding to said selected one of said plurality of first signals and each one of said plurality of latches that is of a lower order than the one of said plurality of latches corresponding to said selected one of said plurality of first signals.

4. An integrated circuit according to claim 3, wherein said third signal represents a binary offset and said counter reset circuitry subtracts said binary offset from said counter.

5. A system, comprising:
(a) a plurality of processors each comprising:
  (i) a clock divider circuit that includes:
    (1) a counter operatively configured to generate a plurality of first signals from a second signal, each one of said plurality of first signals having a first phase and said second signal having a second phase; and
    (2) a mux in electrical communication with said counter and operatively configured to output a selected one of said plurality of first signals; and
  (ii) a phase detector operatively configured to detect an offset between said first phase of said selected one of said plurality of first signals and said second phase of said second signal and generate a third signal representing said offset; and
(b) a synchronization initiation circuit in electrical communication with said phase detector of each of said plurality of processors and operatively configured to provide a synchronization signal to each of said phase detectors for initiating detection of each said offsets.

6. An integrated circuit according to claim 5, wherein at least one of said selected ones propagates to the corresponding one of said phase detectors through a clock mesh having a mesh delay, the corresponding one of said plurality of processors further comprising delay circuitry operatively configured to simulate said mesh delay, said second signal of the corresponding one of said plurality of processors propagating to the corresponding one of said phase detectors through said delay circuitry.

7. An integrated circuit according to claim 5, wherein each one of said selected ones has a frequency equal to the frequency of the corresponding one of said second signal divided by an even integer n and the corresponding one of said phase detector is operatively configured to measure the corresponding one of said selected ones n/2 times to determine the corresponding one of said offsets.

8. An integrated circuit according to claim 5, wherein each one of said counters comprises a plurality of latches each corresponding to a corresponding one of said plurality of first signals, each one of said plurality of processors further comprising counter reset circuitry responsive to the corresponding one of said third signals so as to reset to zero the one of said plurality of latches corresponding to said selected one of said plurality of first signals and each one of said plurality of latches that is of a lower order than the one of said plurality of latches corresponding to said selected one of said plurality of first signals.

9. An integrated circuit according to claim 8, wherein each one of said third signals represents a binary offset and the corresponding one of said counter reset circuitry subtracts said binary offset from the corresponding one of said counter.

10. A method of resetting at least one divide-by counter having an input signal with a first phase, the divide-by counter outputting a plurality of divide-by signals each having a second phase, the method comprising the steps of:
(a) selecting one of the plurality of divide-by signals;
(b) determining a phase offset between the second phase of said selected one of the plurality of divide-by signals and the first phase of the input signal; and
(c) resetting the divide-by counter based upon said phase offset.

11. A method according to claim 10, wherein said selected one of said plurality of divide-by signals propagates through a clock mesh that causes a mesh delay, the method further comprising a step of simulating said mesh delay in the input signal.

12. A method according to claim 10, wherein step (b) includes measuring the magnitude of said selected one of the plurality of divide-by signals.

13. A method according to claim 12, wherein the input signal has a plurality of edges and a plurality of cycles, the method further comprising prior to step (b) the step of providing a synchronization pulse so as to identify which one of the plurality of edges of input signal to use in step (b) as a reference edge, the step of measuring the magnitude of said selected one of the plurality of divide-by signals including measuring the magnitude of said selected one of the plurality of divide-by signals in ones of the plurality of cycles immediately following said reference edge.

14. A method according to claim 13, wherein the input signal has a first frequency and said selected one of the plurality of divide-by signals has a second frequency equal to $1/(2^n)$ times the first frequency, wherein n is an integer, the step of measuring the magnitude of said selected one of the plurality of divide-by signals including taking a measurement during each of $(2^n)/2$ cycles of the input signal.

15. A method according to claim 10, wherein each one of a plurality of divide-by counters are synchronized by performing steps (b) and (c) substantially simultaneously with one another.

16. A method according to claim 15, further including prior to step (b) the step of providing a synchronization pulse so as to initiate step (b) relative to each one of the plurality of divide-by counters.

17. A method according to claim 10, wherein said offset signal represents a binary offset and step (c) comprises subtracting said binary from the at least one divide-by counter.

* * * * *